(12) United States Patent
Ishiyama et al.

(10) Patent No.: US 9,888,617 B2
(45) Date of Patent: Feb. 6, 2018

(54) SEMICONDUCTOR DEVICE HAVING MULTIPLE POWER MODULES AND COOLING MECHANISM FOR THE POWER MODULES

(71) Applicant: Mitsubishi Electric Corporation, Tokyo (JP)

(72) Inventors: Yusuke Ishiyama, Tokyo (JP); Yuji Imoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/231,121

(22) Filed: Aug. 8, 2016

(65) Prior Publication Data

US 2017/0213779 A1 Jul. 27, 2017

(30) Foreign Application Priority Data

Jan. 26, 2016 (JP) .................................. 2016-012096

(51) Int. Cl.
| | |
|---|---|
| H05K 7/20 | (2006.01) |
| H01L 23/473 | (2006.01) |
| H05K 7/14 | (2006.01) |
| H01L 23/367 | (2006.01) |
| H01L 23/40 | (2006.01) |
| H01H 9/52 | (2006.01) |

(52) U.S. Cl.
CPC ..... *H05K 7/20927* (2013.01); *H01L 23/3675* (2013.01); *H01L 23/4012* (2013.01); *H01L 23/473* (2013.01); *H05K 7/1432* (2013.01); *H01H 9/52* (2013.01)

(58) Field of Classification Search
CPC .. H01H 9/52; H05K 7/20927; H05K 7/20272; H05K 7/1432; H01L 23/473
USPC .................. 361/699; 165/80.4–80.5, 104.33; 257/714
See application file for complete search history.

(56) References Cited

U.S. PATENT DOCUMENTS

| | | | | |
|---|---|---|---|---|
| 6,819,561 | B2 * | 11/2004 | Hartzell | F28F 1/045 165/185 |
| 7,173,823 | B1 * | 2/2007 | Rinehart | F28D 9/0031 165/80.4 |
| 9,003,649 | B1 * | 4/2015 | Romero | B23K 20/122 29/830 |
| 9,030,822 | B2 * | 5/2015 | Sharaf | H05K 7/20927 165/104.33 |
| 9,064,846 | B2 | 6/2015 | Nagai et al. | |

(Continued)

FOREIGN PATENT DOCUMENTS

| | | |
|---|---|---|
| JP | 2015-053318 A | 3/2015 |
| JP | 2015-133420 A | 7/2015 |

*Primary Examiner* — Zachary M Pape
(74) *Attorney, Agent, or Firm* — Studebaker & Brackett PC (57) ABSTRACT

Provided is a semiconductor device having a small footprint, where the semiconductor device includes multiple power modules and a cooling structure for these power modules. The semiconductor device includes: a first power module on a first top plate of a coolant jacket; and a second power module on a second top plate of the coolant jacket, where the second top plate face the first top plate. The coolant jacket includes a first fin in contact with the first top plate in a passage, and a second fin in contact with the second top plate in the passage. The power modules face each other through the top plates and the fins.

7 Claims, 5 Drawing Sheets

(56) References Cited

U.S. PATENT DOCUMENTS

| | | | | |
|---|---|---|---|---|
| 9,204,579 | B2* | 12/2015 | Jaskari | H05K 7/20927 |
| 9,646,912 | B2* | 5/2017 | Ushijima | H01L 23/3672 |
| 2013/0154084 | A1* | 6/2013 | Kadoguchi | H01L 23/3121 |
| | | | | 257/717 |
| 2014/0069615 | A1* | 3/2014 | Kusaka | H01L 23/473 |
| | | | | 165/104.19 |
| 2014/0140117 | A1* | 5/2014 | Ishibashi | H05K 7/20927 |
| | | | | 363/141 |
| 2015/0097281 | A1* | 4/2015 | Adachi | H01L 23/473 |
| | | | | 257/714 |
| 2015/0289411 | A1* | 10/2015 | Kamiya | H05K 7/20263 |
| | | | | 361/701 |

* cited by examiner

SEMICONDUCTOR DEVICE HAVING MULTIPLE POWER MODULES AND COOLING MECHANISM FOR THE POWER MODULES

BACKGROUND OF THE INVENTION

Field of the Invention

The present invention relates to a semiconductor device that includes multiple power modules and a cooling mechanism for the power modules.

Description of the Background Art

An example of cooling structures for power modules includes a direct cooling structure in which a base plate with the power modules includes fins on a bottom surface of the base plate. In the direct cooling structure, the base plate is bonded to a side-surface member of a coolant jacket through a seal structure, to thus constitute a top-surface member of the coolant jacket, and the fins are sealed inside the coolant jacket (e.g., Japanese Patent Application Laid-Open No. 2015-53318).

In Japanese Patent Application Laid-Open No. 2015-53318, a semiconductor device includes a cooling structure on only one side of a power module. Hence, in a semiconductor device that requires multiple power modules, where the semiconductor device is intended for use in motor vehicles or other products, semiconductor devices are provided for each power module, or the power modules are arranged on a flat surface. This unfortunately prevents the semiconductor device from having a small footprint.

SUMMARY OF THE INVENTION

It is an object of the present invention to provide a semiconductor device having a small footprint, where the semiconductor device includes multiple power modules and a cooling structure for the power modules.

The semiconductor device according to an aspect of the present invention includes a coolant jacket, a first power module, and a second power module. The coolant jacket includes a passage through which a coolant flows inside the coolant jacket. The coolant jacket also includes a first fin, a second fin, an intake opening, an intake header, a discharge opening, and a discharge header. The first power module is mounted on a first-surface member of the coolant jacket. The second power module is mounted on a second-surface member of the coolant jacket, where the second-surface member faces the first-surface member. The first fin is in contact with the first-surface member in the passage. The second fin is in contact with the second-surface member in the passage. The coolant is taken in from the outside through the intake opening. The intake header is configured to send the coolant entering from the intake opening to the first fin and the second fin. The coolant is discharged to the outside through the discharge opening. The discharge header is configured to send to the discharge opening the coolant passing through the first fin and the second fin. The first power module and the second power module face each other through the first-surface member and the second-surface member, and through the first fin and the second fin.

According to the aspect of the invention, the semiconductor device is configured such that the first and second power modules are provided to face each other. This enables the semiconductor device to have a small footprint.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

Figure 1:
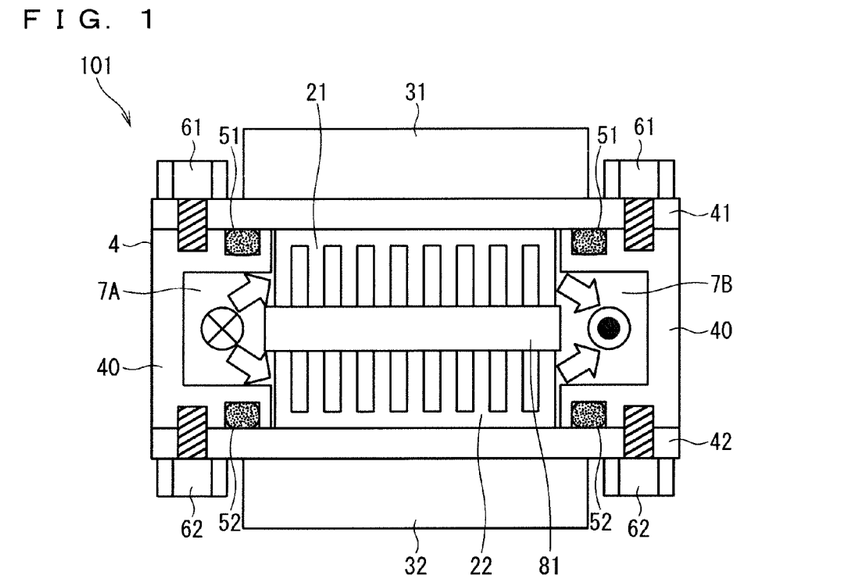
FIG. 1 is a cross sectional view of a semiconductor device according to a first preferred embodiment of the present invention.
Figure 2:
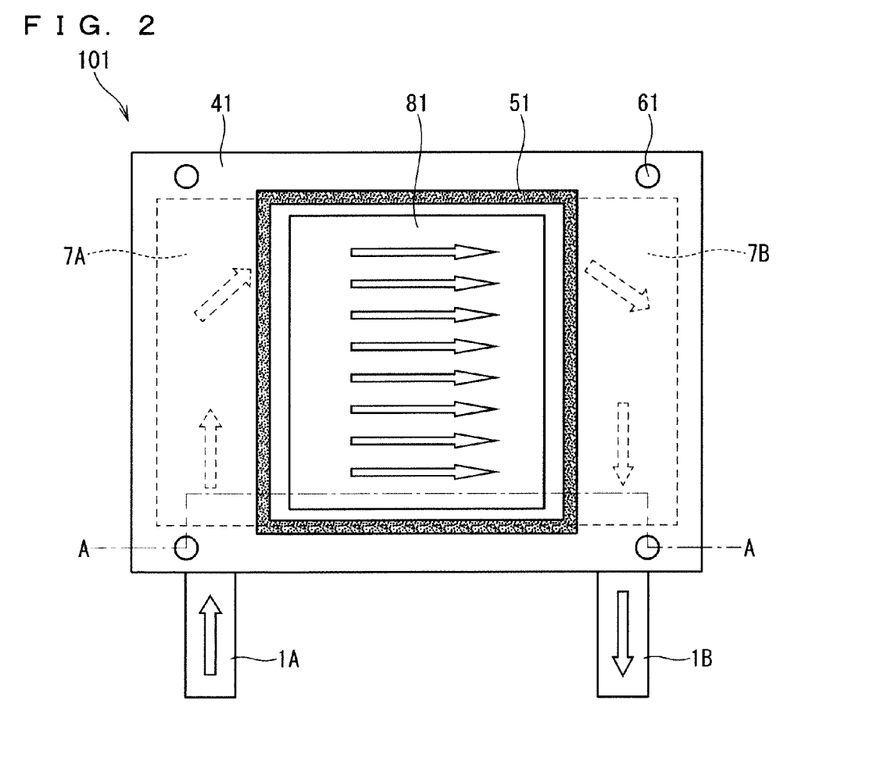
FIG. 2 is a plan view of the semiconductor device according to the first preferred embodiment of the present invention.

FIG. 1 is a cross-sectional view of a configuration of a semiconductor device 101 according to a first preferred embodiment of the present invention. FIG. 2 is a plan view of the semiconductor device 101. FIG. 1 is a cross-sectional view taken along line A-A in FIG. 2.

The semiconductor device 101 has a direct cooling structure. The semiconductor device 101 includes: two power modules 31 and 32, fins 21 and fins 22 for radiating heat of the power modules 31 and 32, and a coolant jacket 4 that cools the fins 21 and 22.

The power module 31 is mounted on a base plate. The fin 21, which is used to radiate the heat of the power module 31, is attached on a back surface of the base plate. Moreover, the base plate, which has the power module 31, is in close contact with a side-surface member 40 (third-surface member) of the coolant jacket 4 through a seal 51. The base plate thus constitutes a top plate 41 that is a top-surface member (first-surface member) of the coolant jacket 4. The top plate 41 and the side-surface member 40 are fastened at their respective four corners with fastening bolts 61.

Further, the power module 32 is mounted on the base plate. The fin 22, which is used to radiate the heat of the power module 32, is attached on the back surface of the base plate. Moreover, the base plate, which has the power module 32, is in close contact with the side-surface member 40 of the coolant jacket 4 through a seal 52. The base plate thus constitutes a top plate 42 that is a bottom-surface member (second-surface member) of the coolant jacket 4. The top plates 41 and 42 face each other. Hence, the power modules 31 and 32 are provided to face each other through the top plates 41 and 42, and through the fins 21 and 22. The top plate 42 and the side-surface member 40 are fastened at their respective four corners with fastening bolts 62.

Examples of the seals 51 and 52 include an O-ring, a liquid gasket, and an ultraviolet-hardened rubber seal. The top plates 41 and 42 are brought into close contact with the side-surface member 40 as described above, so that the fins 21 and 22 are sealed inside the coolant jacket 4. It is noted that the fins 21 and 22 may be joined to the side-surface member 40 by directly brazing or directly welding.

Further, as illustrated in FIG. 2, the coolant jacket 4 includes an intake opening 1A and discharge opening 1B for a coolant. Disposed inside the coolant jacket 4 are an intake header 7A that is a space for sending the coolant entering from the intake opening 1A to the fins 21 and 22, and a discharge header 7B that is a space for sending to the discharge opening 1B the coolant passing through the fins 21 and 22. Moreover, there is a partition plate 81 between and all over the fins 21 and 22. A low-temperature coolant flowing through the intake header 7A is divided into two coolants through the partition plate 81: one passing through the fin 21; and the other passing through the fin 22. These two divided coolants then pass through the respective fins 21 and 22, thus undergoing heat exchange. A high-temperature coolant resulting from the passing through of the fins 21 and 22 is discharged from the discharge opening 1B by way of the discharge header 7B.

Figure 3:
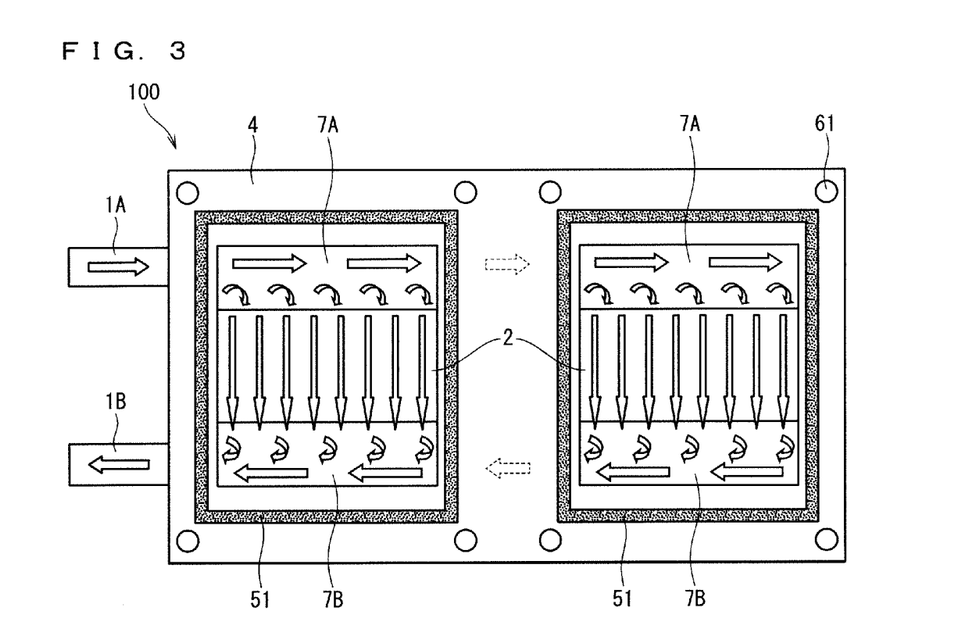
FIG. 3 is a plan view of a semiconductor device according to a comparative example of the present invention.

Reference is now made to a comparative example. FIG. 3 is a plan view of a conventional semiconductor device 100. The conventional semiconductor device 100 is configured such that the coolant jacket 4 has two power modules 31 and 32 on the top plate 41 (top-surface member) of the coolant jacket 4. Hence, the semiconductor device 100 has required a footprint (bottom area) enough for the two power modules.

In contrast, according to the first preferred embodiment of the present invention, the semiconductor device 101 is configured such that the power module 31 is mounted on the top plate 41, which is the top-surface member of the coolant jacket 4, and that the power module 32 is mounted on the top plate 42, which is the bottom-surface member of the coolant jacket 4, so that the power modules 31 and 32 face each other. In other words, the semiconductor device 101 includes: the coolant jacket 4 including inside a passage through which the coolant flows, the power module 31 (first power module) mounted on the top plate 41 (first-surface member) of the coolant jacket 4, and the power module 32 (second power module) mounted on the second-surface member of the coolant jacket 4 facing the first-surface member. The coolant jacket 4 includes: the fin 21 (first fin) in contact with the top plate 41 in the passage; the fin 22 (second fin) in contact with the top plate 42 in the passage; the intake opening 1A through which the coolant is taken in from the outside; the intake header 7A sending the coolant entering from the intake opening 1A to the fins 21 and 22; the discharge opening 1B through which the coolant is discharged to the outside; and the discharge header 7B sending to the discharge opening 1B the coolant passing through the fins 21 and 22. The power modules 31 and 32 face each other through the top plates 41 and 42, and through the fins 21 and 22. Hence, the semiconductor device 101 has a greatly-reduced footprint compared to the semiconductor device 100.

Further, the coolant jacket 4 includes the partition plate 81 partitioning the fins 21 and 22 in the passage. This enables the coolant to flow through both fins 21 and 22.

FIG. 1 illustrates the semiconductor device provided with the two power modules. The present invention is also applicable to a semiconductor device provided with more than two power modules. For instance, a semiconductor device provided with four power modules can be configured such that a set of two power modules are mounted on the top plate 41, and another set of two power modules are mounted on the top plate 42 so that these sets of two modules face each other. Such a configuration enables a reduction in the footprint of the semiconductor device.

B. Second Preferred Embodiment

Figure 4:
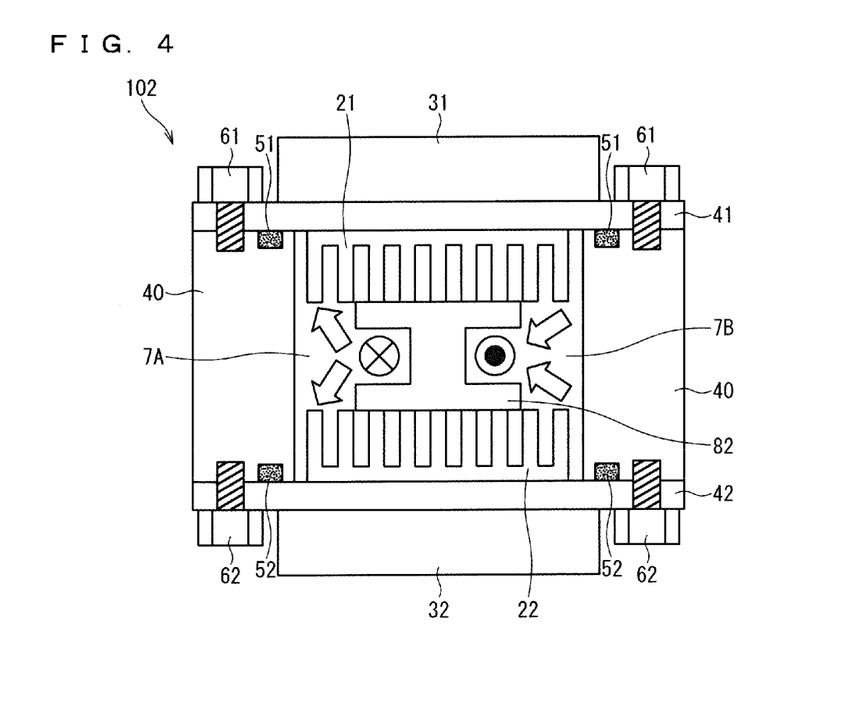
FIG. 4 is a cross-sectional view of a semiconductor device according to a second preferred embodiment of the present invention.
Figure 5:
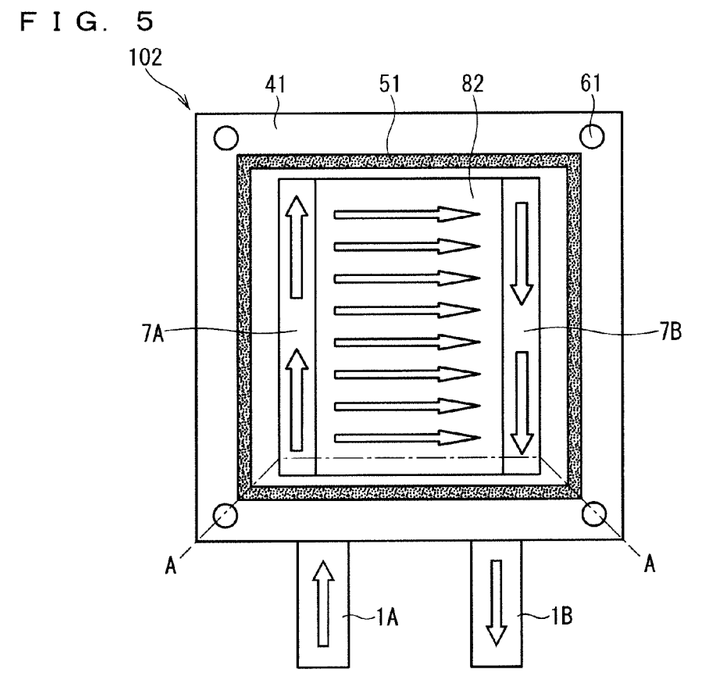
FIG. 5 is a plan view of the semiconductor device according to the second preferred embodiment of the present invention.

FIG. 4 is cross-sectional view of a configuration of a semiconductor device 102 according to a second preferred embodiment. FIG. 5 is a plan view of the semiconductor device 102. FIG. 4 is a cross-sectional view taken along line A-A in FIG. 5. In the first preferred embodiment, the partition plate 81 is disposed all over the fins 21 and 22. The intake header 7A and the discharge header 7B are thus disposed outside the fins 21 and 22. Hence, the sizes of the top plates 41 and 42 are specified by the sizes of the fins 21 and 22, and by the sizes of the intake header 7A and discharge header 7B.

In contrast to this, the semiconductor device 102 includes a partition plate 82 located only in the center of the fins 21 and 22, not in ends of the fins 21 and 22 (left and right ends in FIG. 4). Consequently, ends of a region between the fins 21 and 22, absent from the partition plate 82 can be an intake header 7A and a discharge header 7B.

Further, as illustrated in FIG. 4, the partition plate 82 may have a width larger in its ends that are close to the fins 21 and 22 than that of the rest of the partition plate 82. In other words, the partition plate 82 may have recesses to serve as the intake header 7A and the discharge header 7B.

According to the second preferred embodiment, the semiconductor device 102 is configured such that the intake header 7A and the discharge header 7B are disposed between the fins 21 and 22. Such a configuration enables the semiconductor device 102 to include the top plates 41 and 42 with as small sizes as the footprints of the intake header 7A and discharge header 7B when compared with the semiconductor device 101, in which the intake header 7A and discharge header 7B are disposed outside the fins 21 and 22. Consequently, the semiconductor device 102 has a small footprint.

C. Third Preferred Embodiment

Figure 6:
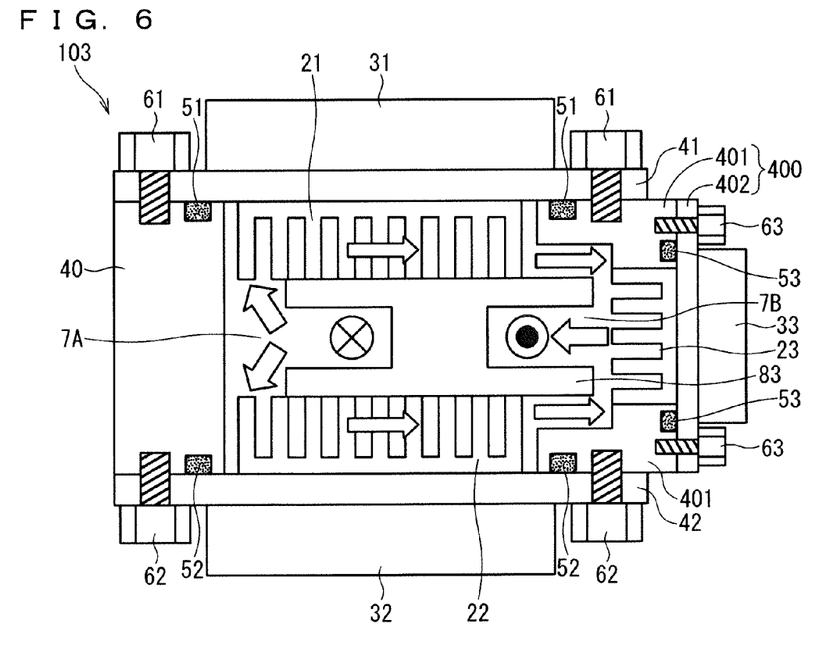
FIG. 6 is a cross-sectional view of a semiconductor device according to a third preferred embodiment of the present invention.

FIG. 6 is a cross-sectional view illustrating a configuration of a semiconductor device 103 according to a third preferred embodiment of the present invention. The semiconductor device 103 includes a power module 33 in a direction where a side surface of a coolant jacket 4 is located.

Specifically, a side-surface member 400 of the coolant jacket 4, which includes the power module 33, includes a side-surface member 401 in close contact with top plates 41 and 42 respectively through seals 51 and 52, and a side-surface member 402 (base plate) in close contact with the side-surface member 401 through a seal 53. In other words, the side-surface members 401 and 402 join together ends of the top plates 41 and 42 facing each other.

The side-surface member 402 has one surface that includes the power module 33, and the other surface on which a fin 23 is joined. The other surface of the side-surface member 402, on which the fin 23 is joined, is in close contact with the side-surface member 401 through the seal 53. Hence, the fin 23 is sealed inside the coolant jacket 4.

Moreover, the side-surface member 402 and the side-surface member 401 are fastened with fastening bolts 63.

In other words, the semiconductor device 103 according to the third preferred embodiment includes the power module 33 (third power module) mounted on the side-surface member 400 (third-surface member) of the coolant jacket 4, where the side—surface member 400 couple together the ends of the top plate 41 (first-surface member) and top plate 42 (second-surface member) of the coolant jacket 4. The coolant jacket 4 includes the fin 23 (third fin) in contact with the side-surface member 400 in a passage. In this way, mounting the respective power modules onto three surfaces of the coolant jacket 4 enables the semiconductor device to have a small footprint, where the semiconductor device includes the three power modules and a cooling structure.

Further, as illustrated in FIG. 6, a partition plate 83 is partially projected from fins 21 and 22 toward the fin 23. Hence, a coolant passing through the fins 21 and 22 passes through the fin 23, and subsequently flows into a discharge header 7B. In other words, the discharge header 7B sends to a discharge opening 1B the coolant, which passes through the fins 21 and 22, followed by the fin 23. Consequently, all the fins 21, 22 and 23 are cooled.

The configuration of the semiconductor device 103 is the same as that of the semiconductor device 102 according to the second preferred embodiment, all but the above-described configuration. The semiconductor device 103 is the same as the semiconductor device 102 also in terms of a side-surface member 40 of the coolant jacket 4 that does not include the power module 33.

It is noted that the coolant may flow in reverse order to the above described order, so that the coolant passing through the fin 23 may pass through the fins 21 and 22.

D. Fourth Preferred Embodiment

Figure 7A:
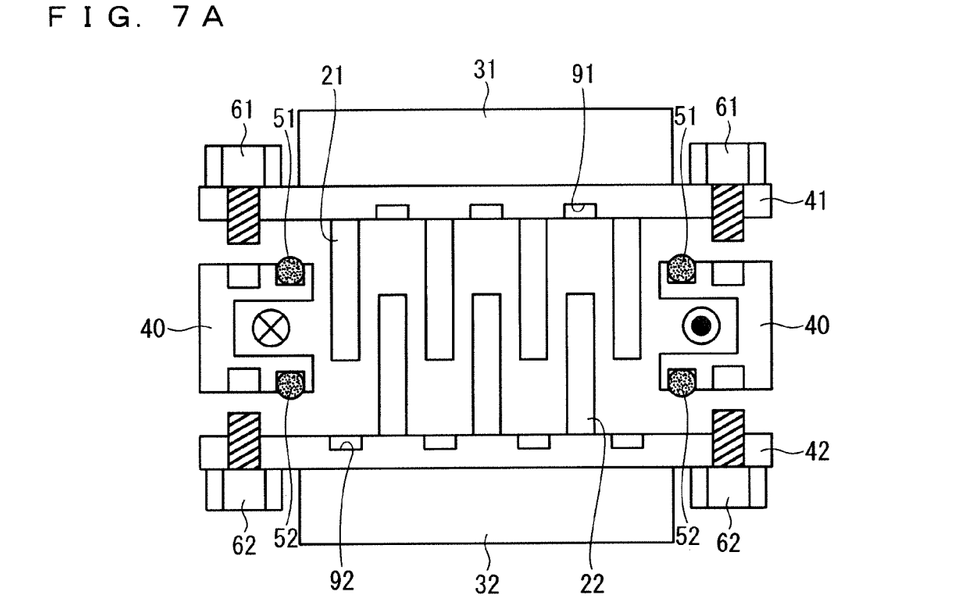
FIGS. 7A and 7B are structural diagrams of a semiconductor device according to a fourth preferred embodiment of the present invention.
Figure 7B:
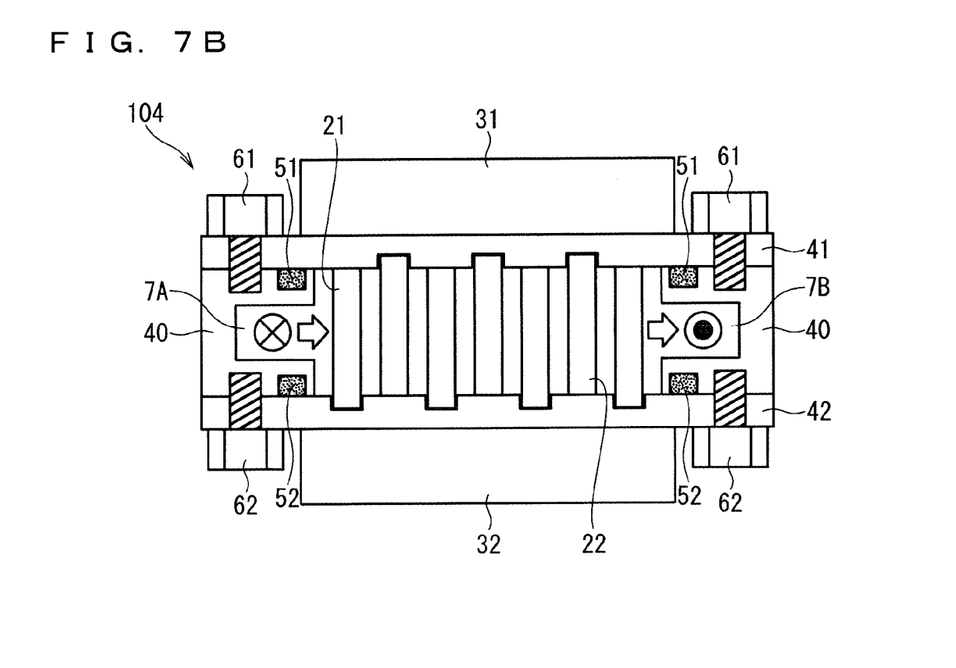
Figure 8:
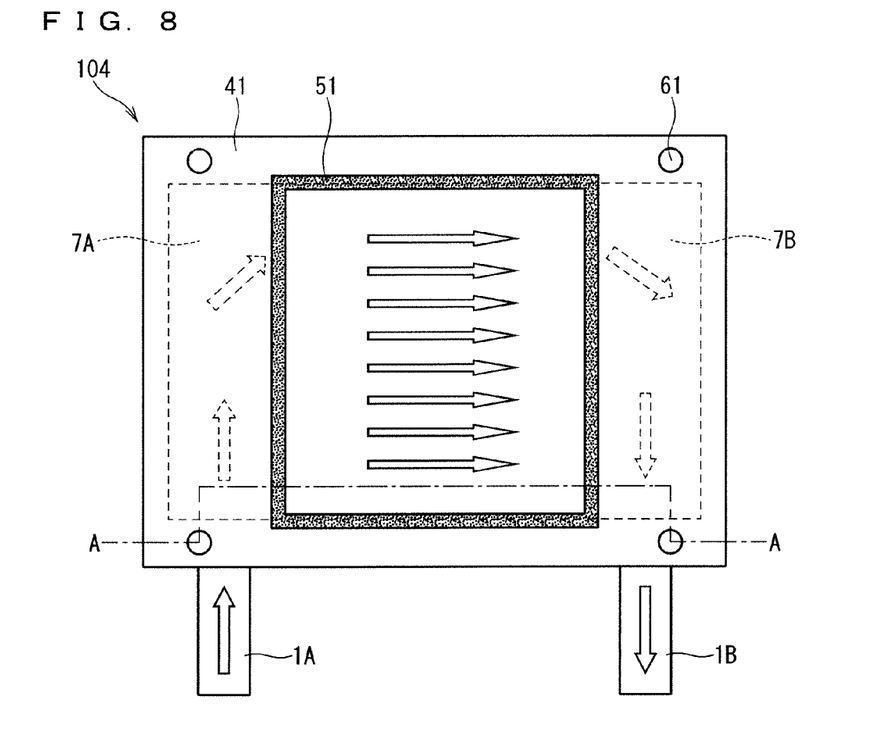
FIG. 8 is a plan view of the semiconductor device according to the fourth preferred embodiment of the present invention.

FIGS. 7A and 7B are cross-sectional views illustrating a configuration of a semiconductor device 104 according to a fourth preferred embodiment of the present invention. FIG. 8 is a plan view of the semiconductor device 104. FIG. 7A illustrates a coolant jacket 4 with a side-surface member 40 and top plates 41 and 42 not yet brought into close contact with each other. FIG. 7B illustrates a complete version of the semiconductor device 104 after the side-surface member 40 and the top plates 41 and 42 are brought into close contact with each other. Moreover, FIG. 7A is a cross-sectional view taken along line A-A in FIG. 8.

With respect to the semiconductor device 101 according to the first preferred embodiment, the semiconductor device 104 is configured such that a partition plate 81 is excluded, and that fins 21 and 22 are alternately arranged along a passage of a coolant jacket 4. Since the fins 21 and 22 are alternately arranged, the coolant passes through both of the fins 21 and 22 without the partition plate 81. Moreover, the fins 21 and 22 do not interfere. This enables the semiconductor device 104 to have a small thickness.

Further, the semiconductor device 104 is configured such that the fin 22 is fitted in a hole 91 disposed on the top plate 41, and that the fin 21 fitted in a hole 92 disposed on the top plate 42. Hence, the fins 21 and 22 are shared by power modules 31 and 32. Moreover, the fin 22 may be caulked or brazed inside the hole 91, and the fin 21 may be caulked or brazed inside the hole 92. This enables the fins to have a further heat-radiation capability.

Figure 9:
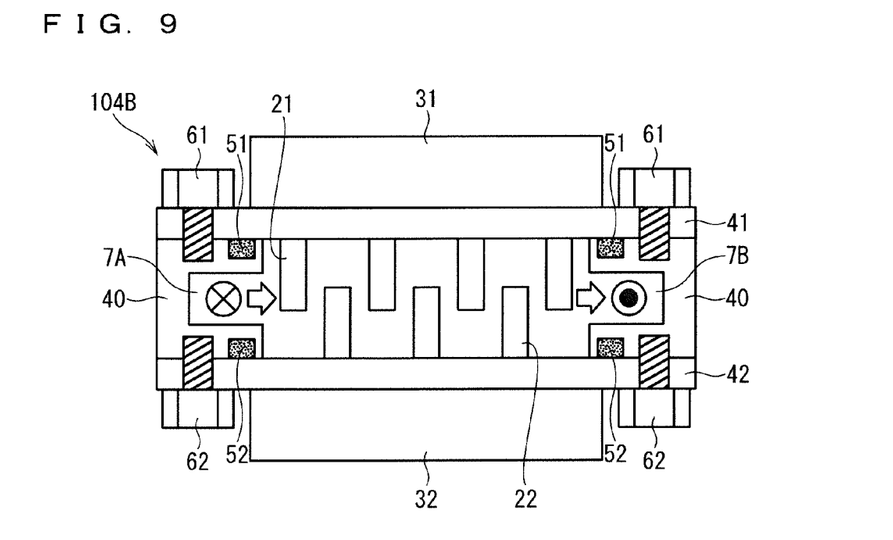
FIG. 9 is a plan view of a semiconductor device according to a variation of the fourth preferred embodiment of the present invention.

In addition, as illustrated in FIG. 9, a semiconductor device 104B may be configured such that the fin 21 is long enough not to be in contact with the top plate 42, and that the fin 22 is long enough not to be in contact with the top plate 41.

Further, in the structures according to the first to fourth embodiments, the power modules 31, 32 and 33 each include a semiconductor element that includes a wide bandgap power semiconductor element. A power module that includes a wide bandgap power semiconductor made of a material such as silicon carbide can operate at high temperature. Hence, the use of the present invention provides a small-sized semiconductor device having a high heat-radiation capability.

It is to be noted that in the present invention, respective preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a coolant jacket comprising a passage through which a coolant flows inside said coolant jacket;
    a first power module mounted on a first-surface member of said coolant jacket;
    a second power module mounted on a second-surface member of said coolant jacket, said second-surface member facing said first-surface member; and
    a third power module mounted on a third-surface member of said coolant jacket, said third-surface member coupling together an end of said first-surface member and an end of said second-surface member,
    wherein said coolant jacket comprises:
        a first fin in contact with said first-surface member in said passage;
        a second fin in contact with said second-surface member in said passage;
        a third fin in contact with said third-surface member in said passage;
        an intake opening through which said coolant is taken in from an outside;
        an intake header configured to send said coolant entering from said intake opening to said first fin and said second fin;
        a discharge opening through which said coolant is discharged to said outside; and
        a discharge header configured to send, to said discharge opening, said coolant passing through said first fin and said second fin, and
    wherein said first power module and said second power module face each other through said first-surface member and said second-surface member, and through said first fin and said second fin.

2. The semiconductor device according to claim 1, wherein said coolant jacket further comprises a partition plate partitioning said first fin and said second fin in said passage.

3. The semiconductor device according to claim 1, wherein said intake header and said discharge header are disposed between said first fin and said second fin.

4. The semiconductor device according to claim 1, wherein said discharge header is configured to send, to said discharge opening, said coolant passing through said first fin and said second fin, followed by said third fin.

5. The semiconductor device according to claim 1, wherein said first power module and said second power module each comprise a semiconductor element comprising a wide bandgap power semiconductor element.

6. A semiconductor device comprising:
- a coolant jacket comprising a passage through which a coolant flows inside said coolant jacket;
- a first power module mounted on a first-surface member of said coolant jacket; and
- a second power module mounted on a second-surface member of said coolant jacket, said second-surface member facing said first-surface member,
- wherein said coolant jacket comprises:
  - a first fin in contact with said first-surface member in said passage;
  - a second fin in contact with said second-surface member in said passage;
  - an intake opening through which said coolant is taken in from an outside;
  - an intake header configured to send said coolant entering from said intake opening to said first fin and said second fin;
  - a discharge opening through which said coolant is discharged to said outside; and
  - a discharge header configured to send, to said discharge opening, said coolant passing through said first fin and said second fin; and
- wherein said first power module and said second power module face each other through said first-surface member and said second-surface member, and through said first fin and said second fin,
- wherein said first fin and said second fin are alternately arranged along said passage without touching each other, and
- wherein both the first fin and the second fin each comprise a plurality of plate-shaped members arranged such that each plate-shaped member has a major axis extending along a first direction, the first direction being substantially perpendicular to a flow path of the coolant as the coolant passes through the first fin and the second fins.

7. A semiconductor device comprising:
- a coolant jacket comprising a passage through which a coolant flows inside said coolant jacket;
- a first power module mounted on a first-surface member of said coolant jacket;
- a second power module mounted on a second-surface member of said coolant jacket, said second-surface member facing said first-surface member,
- wherein said coolant jacket comprises:
  - a first fin in contact with said first-surface member in said passage;
  - a second fin in contact with said second-surface member in said passage;
  - an intake opening through which said coolant is taken in from an outside;
  - an intake header configured to send said coolant entering from said intake opening to said first fin and said second fin;
  - a discharge opening through which said coolant is discharged to said outside; and
  - a discharge header configured to send, to said discharge opening, said coolant passing through said first fin and said second fin,
- wherein said first power module and said second power module face each other through said first-surface member and said second-surface member, and through said first fin and said second fin, and
- wherein said first fin is fitted in, and makes mechanical contact with, said second-surface member, and wherein said second fin is fitted in, and makes mechanical contact with, said first-surface member.

* * * * *